United States Patent
Nagaiwa et al.

(10) Patent No.: US 6,723,202 B2
(45) Date of Patent: Apr. 20, 2004

(54) WORKTABLE DEVICE AND PLASMA PROCESSING APPARATUS FOR SEMICONDUCTOR PROCESS

(75) Inventors: Toshifumi Nagaiwa, Dresden (DE); Shuei Sekizawa, Nakakubiki-gun (JP); Kosuke Imafuku, Nirasaki (JP); Jun Ooyabu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/840,178

(22) Filed: Apr. 24, 2001

(65) Prior Publication Data

US 2002/0029745 A1 Mar. 14, 2002

(30) Foreign Application Priority Data

Apr. 25, 2000 (JP) ........................................ 2000-123540
Oct. 23, 2000 (JP) ........................................ 2000-323208

(51) Int. Cl.⁷ ........................ H01L 21/3065; C23C 16/00
(52) U.S. Cl. ................ 156/915; 156/345.1; 156/345.43; 156/345.53; 118/715; 118/724; 118/728
(58) Field of Search .................. 156/915, 345.53, 156/345.43, 345.1; 118/715, 724, 728

(56) References Cited

U.S. PATENT DOCUMENTS

| 4,282,924 A | * | 8/1981 | Faretra | 118/500 |
|---|---|---|---|---|
| 5,304,278 A | * | 4/1994 | Bartha et al. | 156/345.43 |
| 5,405,491 A | * | 4/1995 | Shahvandi et al. | 156/345.51 |
| 5,556,500 A | * | 9/1996 | Hasegawa et al. | 156/345.27 |
| 5,740,009 A | | 4/1998 | Pu et al. | |
| 5,792,304 A | * | 8/1998 | Tamura et al. | 118/724 |
| 5,868,848 A | * | 2/1999 | Tsukamoto | 118/723 E |
| 5,904,778 A | * | 5/1999 | Lu et al. | 118/723 R |
| 6,096,161 A | * | 8/2000 | Kim et al. | 156/345.47 |
| 6,148,765 A | * | 11/2000 | Lilleland et al. | 118/723 E |

FOREIGN PATENT DOCUMENTS

| JP | 07310187 A | * | 11/1995 | ............ C23C/16/50 |
| JP | 11067717 | * | 3/1999 | ........... H01L/21/306 |
| JP | 11330047 A | * | 11/1999 | ........ H01L/21/3065 |

* cited by examiner

*Primary Examiner*—Gregory Mills
*Assistant Examiner*—Ram N Kackar
(74) *Attorney, Agent, or Firm*—Oblon, Spivak, McClelland, Maier & Neustadt, P.C.

(57) ABSTRACT

A plasma etching apparatus includes a worktable disposed in a hermetic process chamber. The worktable has a main surface for placing a wafer thereon, and a sub-surface for placing a focus ring thereon. A cooling mechanism for supplying cold to the main surface and sub-surface is disposed in the worktable. A heat transfer medium made of conductive silicone rubber is interposed between the sub-surface and focus ring. A press mechanism presses the focus ring toward the sub-surface. The heat transfer medium improves thermal conductivity between the sub-surface and focus ring to be higher than in a case with no thermal transfer medium.

16 Claims, 4 Drawing Sheets

WORKTABLE DEVICE AND PLASMA PROCESSING APPARATUS FOR SEMICONDUCTOR PROCESS

CROSS-REFERENCE TO RELATED APPLICATIONS

This application is based upon and claims the benefit of priority from the prior Japanese Patent Applications No. 2000-123540, Apr. 25, 2000; and 2000-323208, Oct. 23, 2000, the entire contents of both of which are incorporated herein by reference.

BACKGROUND OF THE INVENTION

The present invention relates to a worktable device and plasma processing apparatus which process a target substrate such as a semiconductor wafer or a glass substrate (LCD substrate) for a liquid crystal display (LCD) in a semiconductor process. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

As a plasma processing apparatus for the semiconductor process, for example, a CVD apparatus, etching apparatus, or ashing apparatus is known. The plasma processing apparatus has a hermetic process chamber in which a plasma is to be generated, and a worktable (wafer chuck) on which a target substrate such as a wafer is to be placed in the process chamber.

FIG. 9 is an enlarged sectional view schematically showing part of a conventional worktable structure. As shown in FIG. 9, a wafer W is placed on the main surface of a worktable 91, and a focus ring 92 made of a conductive or insulating material is placed on a sub-surface around the main surface so as to surround the wafer W. A cooling mechanism for cooling the wafer W is disposed in the worktable 91.

When the wafer W is to be subjected to a plasma process, the wafer W is fixed on the worktable 91, the process chamber is held at a predetermined vacuum degree, and a plasma is generated in the process chamber. Ions in the plasma are attracted onto the wafer W by the self bias produced on the worktable 91 side. Thus, the wafer W can be subjected to a predetermined plasma process (e.g., an etching process).

As the temperature of the wafer W is increased by etching, the wafer W is cooled by using the cooling mechanism through the worktable 91. In this case, a backside gas such as helium (He) gas with a good thermal conductivity is supplied between the upper surface of the worktable 91 and the lower surface of the wafer W, so that the heat transfer efficiency between the worktable 91 and wafer W is increased.

In the structure shown in FIG. 9, the focus ring 92 cannot be cooled in the same manner as the wafer W. The focus ring 92 is accordingly heated over time to a temperature much higher than that of the wafer W, and the temperature of the periphery of the wafer W becomes higher than that of the inner side of the periphery. As a result, the etching characteristics degrade on the periphery of the wafer W, leading to problems such as degradation in hole penetration properties or etching selectivity. Hole penetration properties are the characteristics in that the wafer can be reliably etched to a predetermined depth. Poor hole penetration properties mean that penetration is not sufficient and the wafer cannot be etched to a predetermined depth.

In particular, recently, an increase in diameter and micro-patterning degree of the wafer W progress remarkably, and attempts have been made to eliminate waste in a single wafer W so that as many devices as possible can be obtained. For this purpose, devices are formed up to immediately near the edge of the wafer W, and temperature increase of the focus ring 92 greatly influences the yield of the device.

BRIEF SUMMARY OF THE INVENTION

It is an object of the present invention to provide a worktable device and plasma processing apparatus for a semiconductor process, which can process a target substrate with a high planar uniformity without accompanying a change over time.

According to the first aspect of the present invention, there is provided a worktable device for a semiconductor process, which comprises
  a worktable having a main surface for supporting a target substrate and a sub-surface disposed around the main surface,
  a cooling mechanism disposed in the worktable and configured to supply cold to the main surface and the sub-surface,
  a focus ring placed on the sub-surface and configured to surround the target substrate on the main surface, and
  a heat transfer medium interposed between the sub-surface and the focus ring, the heat transfer medium being so disposed as to improve thermal conductivity between the sub-surface and the focus ring to be higher than in a case with no thermal transfer medium.

According to the second aspect of the present invention, there is provided a plasma processing apparatus for a semiconductor process, which comprises
  a hermetic process chamber,
  a supply system configured to supply a process gas into the process chamber,
  an exhaust system configured to vacuum-evacuate an interior of the process chamber,
  an excitation mechanism configured to excite and plasmatize the process gas,
  a worktable disposed in the process chamber and having a main surface for supporting a target substrate and a sub-surface disposed around the main surface,
  a cooling mechanism disposed in the worktable and configured to supply cold to the main surface and the sub-surface,
  a focus ring placed on the sub-surface and configured to surround the target substrate on the main surface, and
  a heat transfer medium interposed between the sub-surface and the focus ring, the heat transfer medium being disposed so as to improve thermal conductivity between the sub-surface and the focus ring to be higher than in a case with no thermal transfer medium.

Additional objects and advantages of the invention will be set forth in the description which follows, and in part will be obvious from the description, or may be learned by practice of the invention. The objects and advantages of the invention may be realized and obtained by means of the instrumentalities and combinations particularly point out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
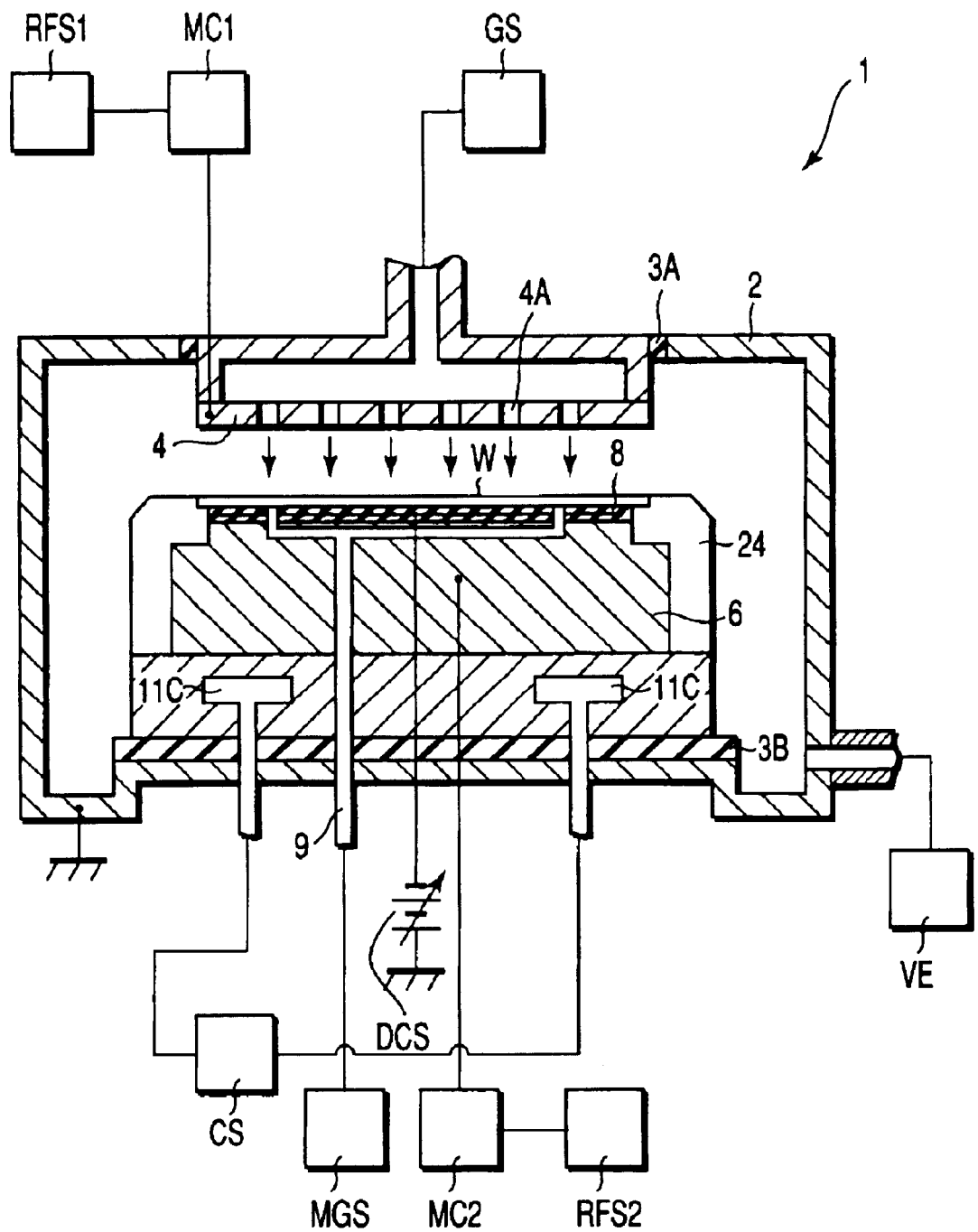
FIG. 1 is a view showing the arrangement of a plasma etching apparatus as a plasma processing apparatus according to an embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

FIG. 1 is a view showing the arrangement of a plasma etching apparatus 1 as a plasma processing apparatus according to an embodiment of the present invention. The plasma etching apparatus 1 has a hermetic cylindrical process chamber 2. The process chamber 2 is made of a conductive material, e.g., aluminum which forms an anodized inner wall surface, and is grounded through a ground line.

A vacuum evacuation unit VE including a turbo-molecular pump and the like is connected to the lower side wall of the process chamber 2 through an exhaust pipe. The vacuum evacuation unit VE evacuates the interior of the process chamber 2 and sets it to a predetermined vacuum degree.

A circular disk-like showerhead 4, connected to a process gas supply unit GS of an etching gas or another gas through a gas supply pipe, is disposed on the ceiling of the process chamber 2. A plurality of holes 4A for spouting the process gas are formed in the lower surface of the showerhead 4. The showerhead 4 has an electrode plate as its bottom plate, and it can be used as an upper electrode as well. The showerhead 4 is insulated from the casing of the process chamber 2 by an insulator 3A.

A substantially columnar worktable 6 for placing a target substrate, e.g., a semiconductor wafer W, is disposed on the bottom of the process chamber 2. The worktable 6 is made of a conductive material, e.g., anodized aluminum or alumina ceramic, and is used as a lower electrode as well. The worktable 6 is insulated from the casing of the process chamber 2 by an insulating plate 3B made of a ceramic material or the like.

A coolant flow path 11C is disposed in the worktable 6. A temperature adjusting coolant such as fluorocarbon liquid (e.g., ethylene glycol) is introduced to the coolant flow path 11C from a coolant source CS disposed outside the process chamber 2. The cold of the coolant is transferred from the coolant flow path 11C to the wafer W through the worktable 6, thereby cooling the wafer W.

A gas passage 9 for supplying a heat transfer medium gas, e.g., He gas, to the lower surface of the wafer W as the target substrate through an electrostatic chuck 8 (to be described later) is formed in the insulating plate 3B and worktable 6. The gas passage 9 is connected to a heat transfer medium gas source MGS disposed outside the process chamber 2. The heat transfer medium gas increases the heat transfer properties between the worktable 6 and wafer W, so the wafer W can be reliably maintained at a predetermined temperature by the coolant described above.

The electrostatic chuck 8 with substantially the same diameter as that of the wafer W is disposed on the worktable 6. The electrostatic chuck 8 is formed of a conductive layer and two polymeric polyimide films sandwiching it. A DC high-voltage power supply DCS arranged outside the process chamber 2 applies a DC voltage of, e.g., 1.5 kV, to this conductive layer. Thus, the wafer W disposed on the upper surface of the electrostatic chuck 8 is attracted and held onto the worktable 6 with the Coulomb force.

The upper electrode, i.e., the showerhead 4, and the lower electrode, i.e., worktable 6, are respectively connected to RF (Radio-Frequency) power supplies RFS1 and RFS2 through matching units MC1 and MC2 each including a decoupling capacitor. The RF power supply RFS1 supplies an RF power of 13.56 MHz or 27.12 MHz to the upper electrode 4, while the RF power supply RFS2 supplies an RF power of 800 kHz to the lower electrode 6. The RF power to the upper electrode 4 forms an RF field in the process chamber 2 in order to excite and thus plasmatize the process gas. The RF power to the lower electrode generates a self bias in the worktable 6 in order to attract ions to the wafer W side.

Figure 2:
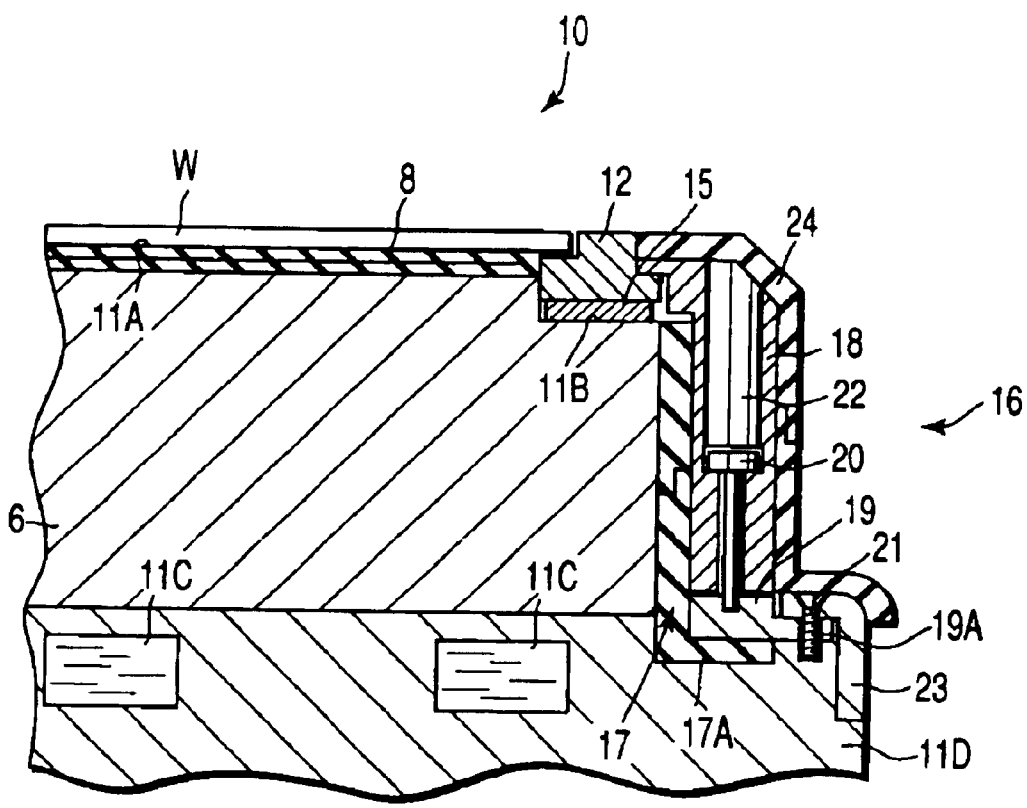
FIG. 2 is an enlarged sectional view schematically showing part of a worktable structure, including a worktable and the like, in the apparatus shown in FIG. 1.
Figure 3:
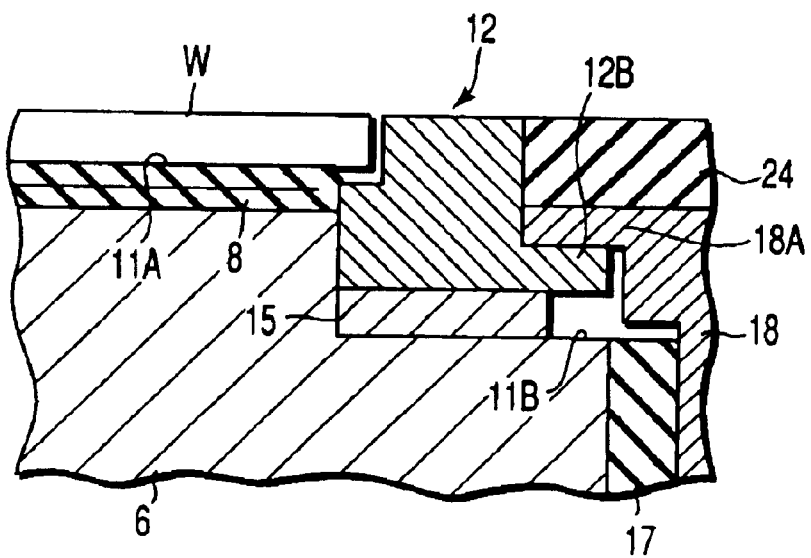
FIG. 3 is an enlarged sectional view showing a portion around the focus ring of the worktable structure shown in FIG. 2.

FIG. 2 is an enlarged sectional view schematically showing part of a worktable structure, including the worktable 6 and the like, in the apparatus shown in FIG. 1. FIG. 3 is an enlarged sectional view showing a portion around the focus ring of the worktable structure 10. The worktable 6 has a circular main surface 11A (the upper surface of the electrostatic chuck 8 in this embodiment) for placing the wafer W as a target substrate thereon, and a ring-like sub-surface 11B for placing thereon a focus ring 12 that surrounds the wafer W. The sub-surface 11B is set to be lower than the main surface 11A by one step so that it accommodates the focus ring 12 with a larger thickness than that of the wafer W.

The focus ring 12 is made of a conductive material such as silicon or silicon carbide. A ring-like heat transfer medium 15 is interposed between the focus ring 12 and sub-surface 11B. The heat transfer medium 15 is disposed such that it increases heat transfer properties between the sub-surface 11B and focus ring 12 to be larger than that in a case wherein no heat transfer medium is disposed. The heat transfer medium 15 is made of a solid material selected from the group consisting of a metal, a ceramic material, a carbon-derivative material (e.g., carbon graphite), and a heat-resistant elastic member. The heat-resistant elastic member can be formed of a conductive material selected from the group consisting of conductive silicone rubber and conductive fluororubber. The focus ring 12 is pressed from above with a press mechanism 16 (to be described above) so that the heat transfer medium 15 comes into tight contact with the sub-surface 11B and focus ring 12.

The focus ring 12 is set such that its upper surface is slightly higher than that of the wafer W on the main surface 11A. The focus ring 12 has a thin portion 12A on its inner side to form a step with respect to its upper surface, as shown in FIG. 3. The periphery of the wafer W on the main surface 11A extends over the first thin portion 12A. The focus ring 12 has a second thin portion 12B on its outer side in the same manner as on the inner side. The thin portion 12B is pressed by the press mechanism 16 (to be described later), so the focus ring 12 is fixed on the sub-surface 11B.

An extension 11D is formed on the outer side of the sub-surface 11B to be lower than that. The outer surface of the worktable 6 is covered, between the sub-surface 11B and extension 11D, with a cylindrical inner cover 17 made of a heat-resistant material, e.g., quartz, that does not generate dust easily. The inner cover 17 has a flange 17A at its lower end. The flange 17A is accommodated in a groove formed on the inner side of the extension 11D so that its upper surface is flush with the extension 11D.

The press mechanism 16 is mounted to the extension 11D so as to be located outside the inner cover 17. The press mechanism 16 has an arrangement as shown in FIG. 2, and presses the focus ring 12 against the sub-surface 11B. More specifically, the press mechanism 16 includes a cylindrical clamp frame 18 for covering the outer surface of the inner cover 17. The clamp frame 18 has a flange 18A inside its upper inner end. The flange 18A engages with the second thin portion 12B of the focus ring 12. The clamp frame 18 is made of, e.g., a heat-resistant material selected from the group consisting of an alumina ceramic material, an aluminum-free ceramic material, and an engineering plastic, that does not generate dust easily. The aluminum-free ceramic material is a ceramic material such as SiN, $Y_2O_3$, and the like that does not contain aluminum. The engineering plastic is a resin such as polyimide, polyether-imide, and polybenzimidazole.

The clamp frame 18 is connected to a lower ring 19 through a plurality of screws 20, and the lower ring 19 is fixed to the extension 11D of the worktable 6 with a plurality of screws 21. In this manner, the press mechanism 16 is fixed to the extension 11D of the worktable 6. The lower ring 19 is made of anodized aluminum.

The clamp frame 18 has vertically extending through holes equidistantly in the angular direction. Each through hole is formed such that its upper half has a larger radius than that of its lower half. Female screws are formed on the lower ring 19 to correspond to the through holes. The screws 20 mounted in the lower halves of the through holes threadably engage with the female screws of the lower ring 19. Columnar members 22 are buried and mounted in the upper halves of the through holes, thereby reinforcing the clamp frame 18. The columnar members 22 are made of the same material as that of the clamp frame 18.

A lower cover 23 for covering a thin portion 19A formed on the outer side of the lower ring 19 is disposed on the periphery of the extension 11D. The lower cover 23 crams down the thin portion 19A of the lower ring 19, and is fixed to the extension 11D of the worktable 6 by the screws 21. The clamp frame 18 and lower cover 23 are covered with an outer cover 24. The outer cover 24 is made of a heat-resistant synthetic resin such as ULTEM (tradename).

The operation of the plasma etching apparatus 1 shown in FIG. 1 will be described.

First, the wafer W in the process chamber 2 is loaded and placed on the worktable 6, and is fixed by the electrostatic chuck 8. The process chamber 2 is set at a hermetic state. After that, the vacuum evacuation unit VE is driven to vacuum-evacuate the interior of the process chamber 2, while the process gas supply unit GS supplies a process gas containing an etching gas through the showerhead 4, to maintain the interior of the process chamber 2 to a predetermined pressure. Simultaneously, the RF power supplies RFS1 and RFS2 apply RF powers to the showerhead 4 and worktable 6. In this manner, the process gas is plasmatized, and a self bias is generated in the worktable 6, so the ions and active species in the plasma etch the wafer W.

During etching, upon bombardment by the plasma, the temperature of the wafer W tends to increase. Therefore, the worktable 6 is cooled with ethylene glycol flowing through the coolant flow path 11C which forms the cooling mechanism, thereby cooling the wafer W. Also, a heat transfer medium gas is supplied between the main surface 11A of the worktable 6 and the lower surface of the wafer W through the gas passage 9. Hence, the wafer W is cooled efficiently and maintained at a constant temperature without being heated to a predetermined temperature or more.

Upon bombardment by the plasma, the temperature of the focus ring 12 on the periphery of the worktable 6 also tends to increase, in the same manner as the wafer. The heat transfer medium 15 made of an elastic conductive silicone rubber is interposed between the focus ring 12 and sub-surface 11B, and the press mechanism 16 presses the focus ring 12 toward the sub-surface 11B. Therefore, the upper and lower surfaces of the heat transfer medium 15 come into tight contact with the focus ring 12 and sub-surface 11B, respectively, to promote heat transfer between the focus ring 12 and worktable 6. Thus, the focus ring 12 can be cooled in the same manner as the wafer W, and be maintained at substantially the same temperature as that of the wafer W, such that substantially no temperature difference occurs between them, or a temperature difference between them, even if it should exist, can be minimized.

As described above, according to this embodiment, the heat transfer medium 15 is disposed between the worktable 6 and focus ring 12. Also, the press mechanism 16 presses and fixes the focus ring 12 against and to the worktable 6. Accordingly, cold is smoothly transferred from the worktable 6 to the focus ring 12 through the heat transfer medium 15. The focus ring 12 can be cooled efficiently, so that the temperature difference between the focus ring 12 and wafer W can be substantially eliminated. As a result, degradation in hole penetration properties and etching selectivity on the periphery of the wafer W can be prevented, and the periphery of the wafer W can be uniformly etched in the same manner as a portion of the wafer W inside the periphery, thus improving the yield.

According to this embodiment, the heat transfer medium 15 is formed from a heat-resistant elastic member of conductive silicone rubber or the like. Therefore, the sub-surface 11B of the worktable 6 and the focus ring 12 can be brought into tight contact with each other through the heat transfer medium 15. The cooling efficiency of the focus ring 12 by the worktable 6 can accordingly be further improved.

The press mechanism 16 includes the clamp frame 18 with the flange 18A which comes into contact with the upper surface of the second thin portion 12B of the focus ring 12 and extends downward from the flange 18A to surround the worktable 6. The clamp frame 18 is fixed to the extension 11D of the worktable 6 through the lower ring 19 with the screws 20. Hence, the press mechanism 16 can press and fix the focus ring 12 against and to the sub-surface 11B throughout its entire circumference.

The clamp frame 18 with the flange 18A, and the lower ring 19 are made of a heat-resistant ceramic material. Therefore, the focus ring 12 can be stably fixed even under a high temperature, so RF discharge can be prevented reliably.

[Experiment]

Using a present example of the plasma etching apparatus with the worktable structure 10 shown in FIGS. 1 and 2 and a comparative example of a plasma etching apparatus with a conventional worktable structure with no heat transfer medium 15 or press mechanism 16, wafer etching was performed to form holes each with a diameter of 0.6 μm with the following condition:

Power applied to upper electrode:
  27.12 MHz, 2,000 W
Power applied to lower electrode:
  800 kHz, 1,400 W
Distance between upper and lower electrodes: 17 mm
Wafer chuck: made of alumina ceramic material
Preset temperature of wafer chuck:
  30° C. (the bottom is at −20° C.)
Preset temperature of wafer: 50° C.
Focus ring: made of conductive silicon
Temperature of focus ring:
  indicated by L1 and L2 in graph of FIG. 4
Vacuum degree in process chamber:
  5.33 Pa (=40 mTorr)
Condition for etching gas:
  $C_4F_8/Ar/O_2=21/510/11$ (sccm)

Figure 4:
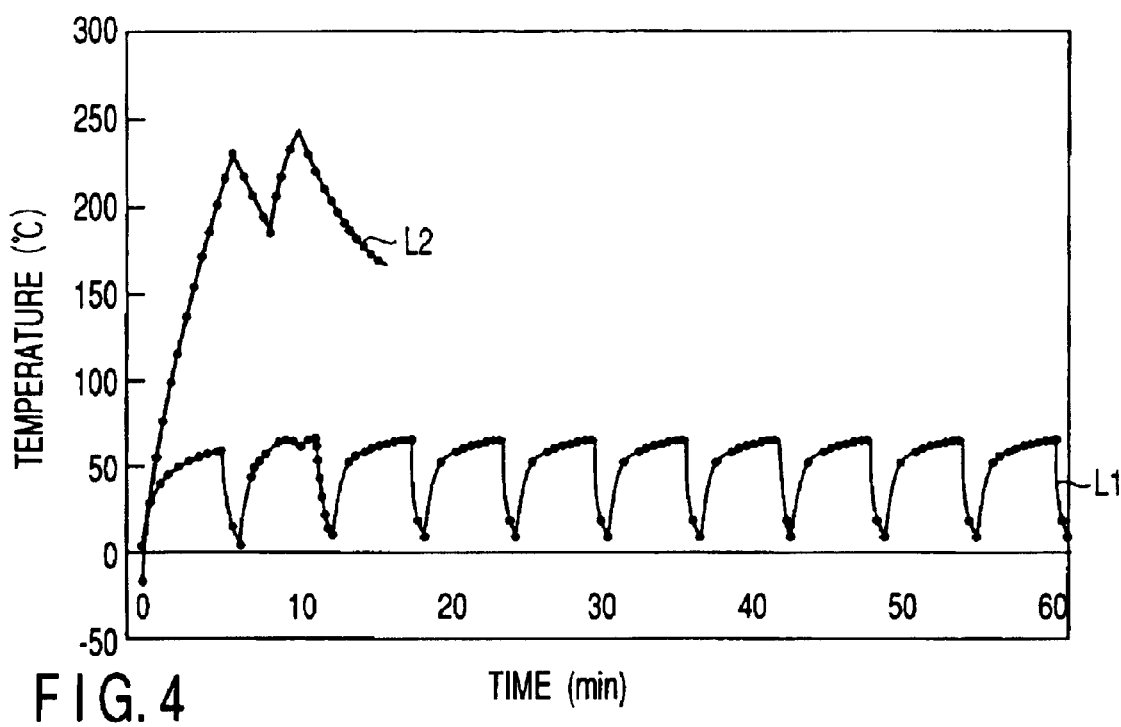
FIG. 4 is a graph showing the surface temperature, obtained in experiments, of the focusing ring during etching.

FIG. 4 is a graph showing the surface temperature, obtained in this experiment, of the focus ring during etching. In FIG. 4, lines L1 and L2 denote the experimental results of the present example and comparative example, respectively. As shown in FIG. 4, in this present example, even with a lapse of time, the surface temperature of the focus ring was not substantially different from the temperature of the wafer W, and changed around 50° C. In contrast to this, in the comparative example, the surface temperature of the focus ring increased sharply and changed in the range of 200° C. to 250° C.

Figure 5A:
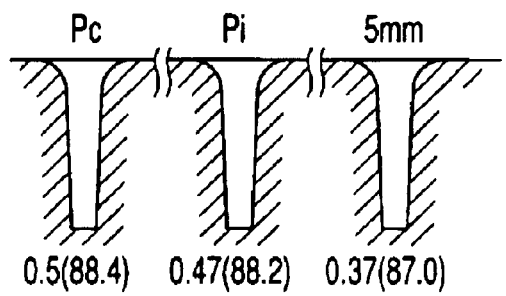
FIGS. 5A, 5B, and 5C are each a schematic view showing the sections of holes in a wafer obtained by experiments.
Figure 5B:
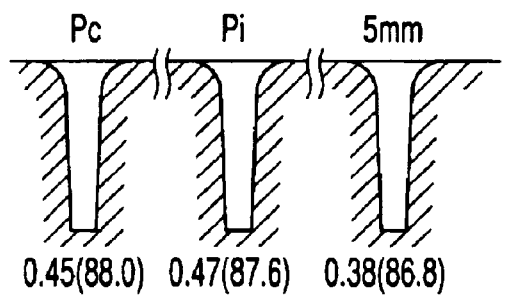
Figure 5C:
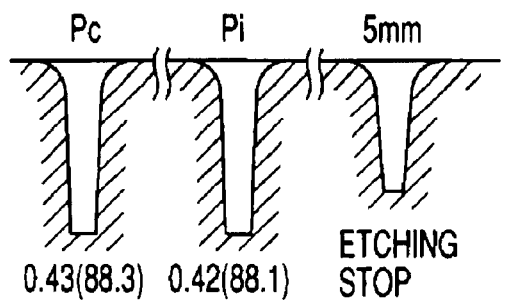

FIGS. 5A, 5B, and 5C are each a schematic view showing the sections of holes in a wafer obtained by this experiment. Referring to each of FIGS. 5A to 5C, the left side shows the etching state of a hole at the center (Pc) of the wafer, the center shows the etching state of a hole at an intermediate position (Pi) between the center and outer periphery, and the right side shows the etching state of a hole formed at a position away from the focus ring by 5 mm. FIG. 5A shows the sections of holes of the 25th wafer in the present example. FIGS. 5B and 5C show the sections of holes in the 1st and 25th wafers of the comparative example.

As shown in FIG. 5A, in this present example, even the 25th wafer could be uniformly etched throughout its entire surface. In contrast to this, in the comparative example, as shown in FIG. 5B, the 1st wafer (before the temperature of the focus ring increased) could be uniformly etched throughout its entire surface, whereas in the 25th wafer, hole penetration was not achieved near the focus ring (see "5 mm"), and etching stopped midway.

Figure 6:
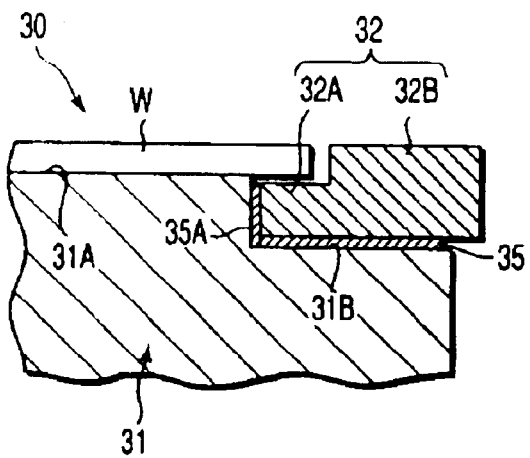
FIG. 6 is an enlarged sectional view showing a portion around a focus ring to show a worktable structure according to another embodiment of the present invention, which can be used in the plasma etching apparatus shown in FIG. 1.

FIG. 6 is an enlarged sectional view showing a portion around a focus ring to show a worktable structure according to another embodiment of the present invention, which can be used in the plasma etching apparatus 1 shown in FIG. 1. A worktable structure 30 according to this embodiment has a worktable 31 to place a wafer W thereon, and a focus ring 32 arranged on the periphery of the worktable 31, as shown in FIG. 6. The worktable structure 30 is formed according to the worktable structure 10 shown in FIG. 2 except for the difference shown in FIG. 6.

The upper surface of the worktable 31 is formed as a main surface 31A where a wafer is to be placed. A sub-surface 31B is formed on the outer side of the main surface 31A to form a step with respect to the main surface 31A, and the focus ring 32 is placed on the sub-surface 31B. The focus ring 32A has, on its inner periphery, a thin portion 32A with an upper side being notched, as shown in FIG. 6. The thickness of the thin portion 32A is almost equal to the height of the main surface 31A. A thick portion 32B of the focus ring 32 has an upper surface substantially flush with that of the wafer W on the main surface 31A.

A ring plate-like heat transfer medium 35 is interposed between the focus ring 32 and sub-surface 31B. The heat transfer medium 35 smoothes heat transfer between the sub-surface 31B and focus ring 32. The heat transfer medium 35 is formed from a heat-resistant conductive member of conductive silicone rubber or the like, and is adhered to the sub-surface 31B. The worktable 31, heat transfer medium 35, and focus ring 32 are set at the same potential to form a uniform plasma on the wafer W.

When the focus ring 32 is arranged on the sub-surface 31B, its inner surface and the main surface 31A form a gap. A filler 35A fills this gap. The filler 35A prevents the plasma from entering the gap, so the outer surface of the main surface 31A and the heat transfer medium 35 are prevented from being damaged by the plasma. The filler 35A is made of the same material as that of the heat transfer medium 35, or an appropriate synthetic resin. The filler 35A may either be formed in advance into a ring-like shape that fills the gap, or fill the gap like a compound. In this embodiment as well, a function and effect similar to those of the worktable structure 10 shown in FIG. 2 can be expected.

Figure 7:
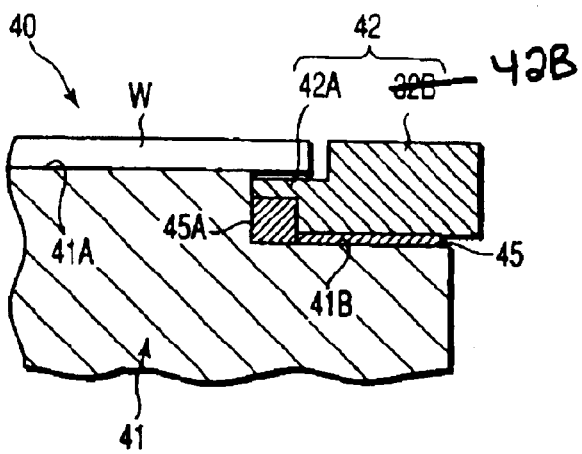
FIG. 7 is an enlarged sectional view showing a portion around a focus ring to show a worktable structure according to still another embodiment of the present invention, which can be used in the plasma etching apparatus shown in FIG. 1.

FIG. 7 is an enlarged sectional view showing a portion around a focus ring to show a worktable structure according to still another embodiment of the present invention, which can be used in the plasma etching apparatus 1 shown in FIG. 1. A worktable structure 40 according to this embodiment has a worktable 41 to place a wafer W thereon, and a focus ring 42 arranged on the outer periphery of the worktable 41, as shown in FIG. 7. The worktable structure 40 is formed according to that of FIG. 6, except that the sectional shape of the focus ring 42 is different from that shown in FIG. 6.

The focus ring 42 has, on its inner periphery, a thin portion 42A with upper and lower sides being notched, as shown in FIG. 7. The height of the upper surface of the thin portion 42A is almost equal to that of a main surface 41A. The inner diameter of the focus ring is slightly larger than the outer diameter of the main surface 41A, but substantially no gap is formed between them. A thick portion 42B of the focus ring 42 has an upper surface substantially flush with that of a wafer W on the main surface 41A. A heat transfer medium 45 is interposed between a sub-surface 41B and the focus ring 42, and is adhered to the sub-surface 41B. A gap is formed between the inner surface of the focus ring 42 and the sub-surface 41B, as shown in FIG. 7, and is filled with a filler 45A. The filler 45A prevents the plasma from entering between the main surface 41A and focus ring 42. In this embodiment as well, a function and effect similar to those of the worktable structure 10 shown in FIG. 2 can be expected.

Figure 8:
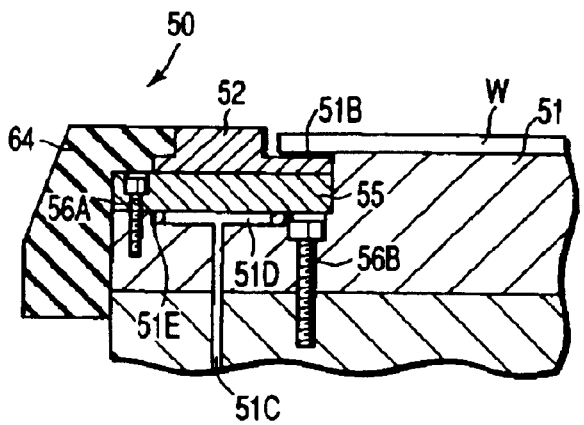
FIG. 8 is an enlarged sectional view showing a portion around a focus ring to show a worktable structure according to still another embodiment of the present invention, which can be used in the plasma etching apparatus shown in FIG. 1.
Figure 9:
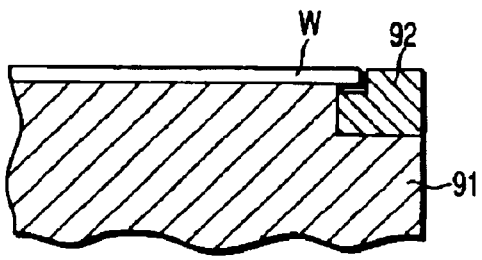
FIG. 9 is an enlarged sectional view schematically showing part of a conventional worktable structure.

FIG. 8 is an enlarged sectional view showing a portion around a focus ring to show a worktable structure according to still another embodiment of the present invention, which can be used in the plasma etching apparatus 1 shown in FIG. 1. A worktable structure 50 according to this embodiment has a worktable 51 to place a wafer W thereon, and a focus ring 52 arranged on the outer periphery of the worktable 51, as shown in FIG. 8. In the worktable structure 50, the mounting structure of the focus ring 52 is different from that of the embodiment shown in FIG. 7.

More specifically, a reinforcing member 55 made of a metal, e.g., aluminum, with a good thermal conductivity, or a ceramic material, e.g., aluminum nitride, is adhered to the lower surface of the focus ring 52 through an epoxy- or silicone-based adhesive with a good thermal conductivity. Accordingly, the mechanical strength of the focus ring 52 is reinforced by the reinforcing member 55 made of the heat transfer medium. The reinforcing member 55 has an outer diameter larger than that of the focus ring 52, and is fixed to a sub-surface 51B, at its portion exposed from the focus ring 52, through a plurality of screws 56A.

The sub-surface 51B has a recess 51D extending throughout its entire circumference so as to be located under the reinforcing member 55. A gas passage 51C formed in the worktable 51 opens to the recess 51D in order to supply a heat transfer medium gas (backside gas). The gas passage 51C is connected to a heat transfer medium gas source (which can be shared as, e.g., the gas source MGS shown in FIG. 1) disposed outside the process chamber 2. The heat transfer medium gas supplied into the recess 51D sealed by the reinforcing member 55 improves the heat transfer properties between the sub-surface 11B and focus ring 12, in the same manner as the heat transfer medium 15, 35, or 45 made of the solid material described above. The heat transfer medium gas can be a gas containing part of the composition of the process gas, e.g., an inert gas such as He, or an etching gas.

The recess 51D is sealed by an O-ring 51E. Furthermore, the outer peripheries of the focus ring 52 and reinforcing member 55 are covered with a quartz cover 54. The cover 54 protects the outer surfaces of the worktable 51, focus ring 52, and reinforcing member 55 from the plasma. In FIG. 8, reference numeral 56B denotes a screw for fastening the worktable 51 to a temperature-adjusting mechanism for cooling and heating. In this embodiment as well, a function and effect similar to those of the worktable structure 10 shown in FIG. 2 can be expected.

The present invention is not limited by the embodiments described above. It suffices as far as a heat transfer medium is interposed between the focus ring and worktable to smooth heat transfer between them. Accordingly, the heat transfer medium may be either adhered to or simply placed on the sub-surface. The focus ring and the heat transfer medium need not be adhered to each other. The filler can be attached to the sub-surface like the heat transfer medium.

In the above embodiments, the semiconductor process is exemplified by plasma etching. Alternatively, the present invention can also be applied to other semiconductor processes, e.g., film formation or ashing. The present invention can be similarly applied to either a semiconductor wafer or an LCD substrate as a target substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A worktable device for a semiconductor process, comprising:
    an electrically conductive worktable having a main surface for supporting a target substrate and a sub-surface disposed around said main surface;
    a cooling mechanism disposed in said worktable and configured to supply cold to the main surface and the sub-surface;
    a focus ring placed on the sub-surface and configured to surround the target substrate on the main surface, said focus ring consisting essentially of an electrically conductive material;
    a heat transfer medium interposed between the sub-surface and said focus ring, said heat transfer medium being so disposed so as to improve thermal conductivity between the sub-surface and said focus ring to be higher than in a case with no thermal transfer medium, said heat transfer medium consisting essentially of an electrically conductive and heat-resistant elastic member selected from the group consisting of conductive silicone rubber and conductive fluororubber; and
    a clamp configured to press said focus ring against the sub-surface,
    wherein said cooling mechanism maintains said target substrate and the focus ring at substantially the same temperature.

2. The device according to claim 1, wherein said clamp comprises a clamp frame having a contact portion which comes from above and fits with a thin portion of said focus ring formed on its outer side, and an extending portion extending downward from the contact portion along a side portion of said worktable.

3. A worktable device for a semiconductor process, comprising:
    a worktable having a main surface for supporting a target substrate and a sub-surface disposed around said main surface;
    a cooling mechanism disposed in said worktable and configured to supply cold to the main surface and the sub-surface;
    a focus ring placed on the sub-surface and configured to surround the target substrate on the main surface;
    a heat transfer medium interposed between the sub-surface and said focus ring, said heat transfer medium being so disposed as to improve thermal conductivity between the sub-surface and said focus ring to be higher than in a case with no thermal transfer medium;
    a clamp configured to process said focus ring against the sub-surface;
    wherein said clamp comprises a clamp frame having a contact portion which comes into contact with said focus ring from above, and an extending portion extending downward from the contact portion along a side portion of said worktable, and an outer cover substantially made of heat-resistant synthetic resin and configured to cover said clamp frame, and wherein said cooling mechanism maintains said target substrate and the focus ring at substantially the same temperature.

4. The apparatus according to claim 3, wherein said heat transfer medium consists essentially of a heat transfer medium gas, and said apparatus further comprises a gas passage, formed in said worktable, in order to supply the heat transfer medium gas between the sub-surface and the focus ring.

5. A plasma processing apparatus for a semiconductor process, comprising:

a hermetic process chamber;

a supply system configured to supply a process gas into said process chamber;

an exhaust system configured to vacuum-evacuate an interior of said process chamber;

an excitation mechanism configured to excite and plasmatize the process gas;

an electrically conductive worktable disposed in said process chamber and having a main surface for supporting a target substrate and a sub-surface disposed around the main surface;

a cooling mechanism disposed in said worktable and configured to supply cold to the main surface and the sub-surface;

a focus ring placed on the sub-surface and configured to surround the target substrate on the main surface, said focus ring consisting essentially of a conductive material;

a heat transfer medium interposed between the sub-surface and said focus ring, said heat transfer medium being disposed so as to improve thermal conductivity between the sub-surface and said focus ring to be higher than in a case with no thermal transfer medium, said heat transfer medium consisting essentially of an electrically conductive and heat-resistant elastic member selected from the group consisting of conductive silicone rubber and conductive fluororubber; and a clamp configured to press said focus ring against the sub-surface, wherein said cooling mechanism maintains said target substrate and the focus ring at substantially the same temperature.

6. The device according to claim 5 wherein said clamp comprises a clamp frame having a contact portion which comes from above and fits with a thin portion of said focus ring formed on its outer side, and an extending portion extending downward from the contact portion along a side portion of side worktable.

7. The apparatus according to claim 5, to further comprising an electrostatic chuck disposed on the main surface and configured to fix the target substrate, and a gas passage formed in said worktable and configured to supply a heat transfer medium gas between said electrostatic chuck and the target substrate.

8. A worktable device for a semiconductor process, comprising:

a worktable having a main surface for supporting a target substrate and a sub-surface disposed around said main surface;

a cooling mechanism disposed in said worktable and configured to supply cold to the main surface and the sub-surface;

a focus ring placed on the sub-surface and configured to surround the target substrate on the main surface;

a heat transfer medium interposed between the sub-surface and said focus ring, said heat transfer medium being so disposed as to improve thermal conductivity between the sub-surface and said focus ring to be higher than in a case with no thermal transfer medium; and a clamp configured to press said focus ring against the sub-surface, wherein said cooling mechanism maintains said target substrate and the focus ring at substantially the same temperature; and wherein said clamp comprises an outer cover consisting essentially of a heat-resistant synthetic resin.

9. The device according to claim 8, wherein said heat transfer medium consists essentially of a heat transfer medium gas, and said apparatus further comprises a gas passage, formed in said worktable, in order to supply the heat transfer medium gas between the sub-surface and said focus ring.

10. The device according to claim 9, wherein said heat transfer medium consists essentially of an inert gas or a gas containing part of a composition of a process gas to be supplied around said worktable.

11. The device according to claim 8, wherein said heat transfer medium consists essentially of the heat-resistance elastic member.

12. The device according to claim 8, wherein said heat transfer medium consists essentially of a heat transfer medium gas, and said apparatus further comprising a gas passage to supply the heat transfer medium gas between the sub-surface and said focus ring.

13. The device according to claim 8, wherein said heat transfer medium consists essentially of an inert gas or a gas containing part of a composition of a process gas to be supplied around said worktable.

14. The device according to claim 8, wherein said focus ring consists essentially of a conductive material.

15. A worktable device for a semiconductor process, comprising:

an electrically conductive worktable having a main surface for supporting a target substrate and a sub-surface disposed around said main surface;

a cooling mechanism disposed in said worktable and configured to supply cold to the main surface and the sub-surface;

a focus ring placed on the sub-surface and configured to surround the target substrate on the main surface, said focus ring consisting essentially of an electrically conductive material;

a heat transfer medium interposed between the sub-surface and said focus ring, said heat transfer medium being so disposed as to improve thermal conductivity between the sub-surface and said focus ring to be higher than in a case with no thermal transfer medium, said heat transfer medium, consisting essentially of an electrically conductive and heat-resistant elastic member, and said cooling mechanism maintaining said target substrate and the focus ring at substantially the same temperature.

16. A plasma processing apparatus for a semiconductor process, comprising:

a hermetic process chamber;

a supply system configured to supply a process gas into said process chamber;

an exhaust system configured to vacuum-evacuate an interior of said process chamber;

an excitation mechanism configured to excite and plasmatize the process gas;

an electrically conductive worktable disposed in said process chamber and having a main surface for supporting a target substrate and a sub-surface disposed around the main surface;

a cooling mechanism disposed in said worktable and configured to supply cold to the main surface and the sub-surface;

a focus ring placed on the sub-surface and configured to surround the target substrate on the main surface, said focus ring consisting essentially of a conductive material; and a heat transfer medium interposed between the sub-surface and said focus ring, said heat transfer medium being disposed so as to improve thermal conductivity between the sub-surface and said focus ring to be higher than in a case with no thermal transfer medium, said heat transfer medium consisting essentially of an electrically conductive and heat-resistant elastic member, and said cooling mechanism maintaining said target substrate and the focus ring at substantially the same temperature.

* * * * *